(12) United States Patent
Cervera

(10) Patent No.: US 12,047,077 B2
(45) Date of Patent: Jul. 23, 2024

(54) HIGH-ACCURACY ADAPTIVE DIGITAL FREQUENCY SYNTHESIZER FOR WIRELESS POWER SYSTEMS

(71) Applicant: CAPOW TECHNOLOGIES LTD, D.n. Hof Ashkelon (IL)

(72) Inventor: Alon Cervera, Rehovot (IL)

(73) Assignee: CAPOW TECHNOLOGIES LTD, D.n. Hof Ashkelon (IL)

( * ) Notice: Subject to any disclaimer, the term of this patent is extended or adjusted under 35 U.S.C. 154(b) by 0 days.

(21) Appl. No.: 18/010,234

(22) PCT Filed: Jun. 17, 2021

(86) PCT No.: PCT/IL2021/050737
§ 371 (c)(1),
(2) Date: Dec. 14, 2022

(87) PCT Pub. No.: WO2021/255739
PCT Pub. Date: Dec. 23, 2021

(65) Prior Publication Data
US 2023/0253959 A1 Aug. 10, 2023

(30) Foreign Application Priority Data

Jun. 18, 2020 (IL) .......................................... 275511

(51) Int. Cl.
*H03K 3/03* (2006.01)
*H03K 5/14* (2014.01)
(Continued)

(52) U.S. Cl.
CPC ............ *H03K 3/0315* (2013.01); *H03K 5/14* (2013.01); *H03K 5/22* (2013.01); *H03K 2005/00078* (2013.01)

(58) Field of Classification Search
None
See application file for complete search history.

(56) References Cited

U.S. PATENT DOCUMENTS 10,790,837 B1 * 9/2020 Azam .................... H03K 3/011
10,826,501 B1 * 11/2020 Coban ................... H03L 7/0995
(Continued)

FOREIGN PATENT DOCUMENTS

CN 110838845 A 2/2020

OTHER PUBLICATIONS

Search Report and Written Opinion issued in PCT Application No. PCT/IL2021/050737, mailed Oct. 20, 2021.

*Primary Examiner* — Cassandra F Cox
(74) *Attorney, Agent, or Firm* — MARSHALL, GERSTEIN & BORUN LLP

(57) ABSTRACT

A high-resolution adaptive digital frequency synthesizer Integrated Circuit (IC) for wireless power systems, which comprises a digitally controlled tunable ring-oscillator, based on a chain of delay-line cells (DLs) being adapted to generate an internal high-resolution reference clock signal; a tuner unit for receiving as input a compensation/target signal and performing arithmetic operations that produce auxiliary tuning signals provided to the ring-oscillator, for allowing the ring-oscillator to generate a high-resolution output period/frequency; a counter-comparator unit introducing an additional delay to the chain, the counter-comparator unit operating in combination with the ring-oscillator and counts how many times the delay of the chain repeats, for providing ultra-fine tuning signal for tuning the frequency resolution of digitally controlled ring-oscillator; an adaptive Fractional-N dithering module, for enhancing the frequency resolution of the digitally controlled ring-oscillator by averaging the resolution provided by a single delay-line cell of the ring-oscillator.

15 Claims, 11 Drawing Sheets

(51) Int. Cl.
*H03K 5/22* (2006.01)
*H03K 5/00* (2006.01)

(56) References Cited

U.S. PATENT DOCUMENTS

| | | |
|---|---|---|
| 2010/0260242 A1 | 10/2010 | Abe et al. |
| 2016/0006421 A1 | 1/2016 | Saric et al. |
| 2016/0118990 A1 | 4/2016 | Faisal et al. |
| 2016/0359493 A1 | 12/2016 | Chen et al. |
| 2017/0012632 A1 | 1/2017 | Yamauchi et al. |
| 2017/0244544 A1 | 8/2017 | Galton et al. |

* cited by examiner

HIGH-ACCURACY ADAPTIVE DIGITAL FREQUENCY SYNTHESIZER FOR WIRELESS POWER SYSTEMS

FIELD OF THE INVENTION

The present invention relates to the field of wireless power transmission systems. More particularly, the present invention relates to a high-accuracy adaptive digital frequency synthesizer Integrated Circuit (IC), for wireless power transmission systems.

BACKGROUND OF THE INVENTION

Over that last decade, there has been an increasing interest in the swiftly growing technology of Wireless Power Transfer (WPT), which has been evolved into a standard feature in many daily-used applications [1]-[5]. WPT technology is the main enabler to eliminate the need for cords, and to reduce the significant dependency of volume-sensitive portable applications on embedded bulky batteries as a reliable main source of energy [6]-[8].

There are several existing WPT technologies for near-field wireless power transfer: Inductive Power Transfer (that couples power from a "track" being an elongated coil to a pickup coil on the receiver where both the track and the pickup coil are tuned at the operating frequency to enhance the power transfer), Capacitive Power Transfer (CPT—a capacitive, rather than inductive interface to deliver power, where the capacitive interface the field is confined between conductive plates, alleviating the need for magnetic flux guiding and shielding components that add bulk and cost to inductive solutions), and Resonant-Based WPT (RWPT-WPT which is based on resonant coupling) systems. However, a main bottleneck in these technologies, in static WPT applications and in particular in dynamic applications, is that that the power transfer capability and efficiency strongly depend on the distance and alignment between the transmitting and receiving sides [9]-[11].

In addition, the coupling coefficient of the transfer medium and load conditions are sensitive to changes in the environment, component aging and temperature drifts, which dramatically decrease the power transfer capabilities of the system. Reducing the sensitivity of the WPT system to variations can be alleviated by passive compensation such as designing matching networks that provide loose coupling between the transmitting and receiving sides [12]-[15]. However, the system characteristics still strongly depend of the component values and the precision of the operating frequency. To fully disengage the system's characteristics from any drifts, changes and variations, a closed-loop active compensation is essential.

A well-known approach to control WPT systems is based on frequency tuning [16]-[24]. Several solutions employed frequency tuning by maximum power point tracking [16]-[19], where the controller seeks for the peak power which is obtained at resonance and tunes the operating frequency accordingly. However, even though it provides flexibility in power regulation, this approach comes at the cost of potential slow dynamics of the system and potential degradation of the overall efficiency.

Another known technique for automated frequency tuning has been utilized based on phase angle detection [20]-[24]. Although reasonable dynamics can be obtained, this approach introduces a major tradeoff between frequency resolution and operation range. This can be improved by using custom designed analog-oriented architectures IC. However, the design efforts, die area and overall power consumption will significantly increase.

On the other hand, digital-oriented architectures can be found very attractive in terms of design efforts and integration [25], [26]. The main limiting factor of digital-based frequency synthesizers is that commonly used digital platforms provide time-resolution on the order of several hundreds of pico-seconds [26]-[29]. Even in the context of fixed frequency controllers, high-resolution frequency synthesizer is essential, particularly in RWPT systems, since the operating frequency may exceed the allocated bandwidth for wireless network regulation. For example, in the used Industrial, Scientific and Medical (ISM) bands of 6.78 MHz operation, the allocated frequency band is ±15 kHz [30], and at 13.56 MHz the frequency band is ±7 kHz [31] which are very narrow bandwidths for accurate calibration.

Some existing solutions for synthesizing accurate signals are using a ring oscillator which consists of a chain of an odd number of delay line cells (stages), in feedback. The number of delay stages determines the oscillation frequency. For example, if the delay of each delay stage is 1 nS then a ring oscillator that consists of a chain of 10 delay stages will provide a delay of 10 nS, which is equivalent to oscillation frequency of 100 MHz. The ring oscillator operates in combination with a counter that counts how many times the delay of the chain repeats. However, these solutions require a fast and accurate counter, which is complex, consumes power and occupies silicon area.

Therefore, to obtain tunable high-frequency operation while maintaining a high-resolution, without significant increasing the power consumption and required silicone area, a dedicated Application Specific Integrated Circuit (ASIC) with specifically tailored hardware that can be realized through a simple design flow is required.

It is therefore an object of the present invention to provide an adaptive high-resolution, scalable digital frequency synthesizer IC architecture for WPT systems, with reduced power consumption and silicon area.

It is another object of the present invention to provide a high-performance adaptive high-resolution digital frequency synthesizer integrated circuit (IC) for wireless power systems, which overcomes the limitations due to potential drifts, changes and variations.

It is another object of the present invention to provide a high-performance adaptive high-resolution digital frequency synthesizer integrated circuit (IC) for wireless power systems, which is independent of the component values and the precision of the operating frequency.

Other objects and advantages of the invention will become apparent as the description proceeds.

SUMMARY OF THE INVENTION

A high-resolution adaptive digital frequency synthesizer Integrated Circuit (IC) for wireless power systems, which comprises:
  a. a digitally controlled tunable ring-oscillator, based on a chain of delay-line cells (DLs) being adapted to generate an internal high-resolution reference clock signal $f_{ring}$;
  b. a tuner unit for receiving as input a compensation/target signal and performing arithmetic operations that produce auxiliary tuning signals provided to the ring-oscillator, for allowing the ring-oscillator to generate a high-resolution output period/frequency;
  c. a counter-comparator unit introducing an additional delay to the chain, the counter-comparator unit operating in combination with the ring-oscillator and counts how many times the delay of the chain repeats, for providing ultra-fine tuning signal for tuning the frequency resolution of digitally controlled ring-oscillator; and d. an adaptive Fractional-N dithering module, for enhancing the frequency resolution of the digitally controlled ring-oscillator by averaging the resolution provided by a single delay-line cell of the ring-oscillator.

In one aspect, the tuner unit receives as input pre-defined parameters for initialization and a compensation/reference signal and outputs the following auxiliary tuning signals:

a. a coarse-tuning signal (Y1) that defines how many complete oscillator cycles are needed for generating the output period/frequency;

b. a fine-tuning signal (Y2) that defines how many extra delay elements should be added to the oscillator's chain to improve the resolution;

c. an ultra-fine-tuning signal (Y3) that defines how many oscillator cycles should have an additional delay element within the output period; and d. an enhancement signal (Y4) that defines the sequencing of adding an extra delay element to the oscillator chain, for further improving the resolution of the output period to be finer than the resolution of a single delay-line cell.

The frequency synthesizer may further comprise a synchronization unit, for simultaneously passing and locking the auxiliary tuning parameters received from the tuner, and provided to the high-resolution internal reference clock signal during every period, to avoid frequency glitches and the generation of false frequency tuning signals.

In one aspect, the counter-comparator unit receives as an input:

a. the coarse tuning signal;
b. the ultra-fine tuning signal; and
c. the internal reference clock $f_{ring}$, and outputs a modulus signal which allows adding an extra delay-line cell to the ring-oscillator, to improve the resolution of the output signal.

The adaptive Dither unit may comprise a logic component, which is adapted to:

receive the enhancement signal and the internal reference clock signal $f_{ring}$ provided by the ring-oscillator;

perform a logic operation between the enhancement signal and the internal reference clock signal $f_{ring}$;

produce a Dither signal which sequentially enables adding extra delay-element to the ring-oscillator, to further improve the resolution of the output signal.

The adaptive ring-oscillator may further comprise:

a. a start-up circuit, which receives as input an enable signal and outputs a triggering signal to initiate a tuning procedure upon power-up of the frequency synthesizer, and to synthesize the internal reference clock $f_{ring}$;

b. a calibration module, which receives calibration signals from a serial communications port, and compensates for variations in process, voltage and temperature, and for post-fabrication mismatches;

c. a Modulus bit block which receives as input the Modulus signal and a delayed version of the internal reference clock $f_{ring}$ and increases or decreases the delay within the ring-oscillator;

d. a Dither bit module for increasing/decreasing sequenced delay within the oscillator, which receives as input the Dither signal and a delayed version of the internal reference clock $f_{ring}$; and e. main DL-string and fine-tuning DL-string for producing high-resolution feedback signal to fine-tune the internal reference clock $f_{ring}$, which receives as input:
i. the Dither signal; and
ii. delayed version of the internal reference clock $f_{ring}$;

The trigger signal may be generated by a one-shot timer, based on a chain of delay-line cells.

In one aspect, a wide-range, high-frequency, high-resolution output signal is generated, with time resolution significantly finer than a propagation time of a single digital delay-element.

A fixed-frequency may be generated with high-resolution output signal, with time resolution significantly finer than a propagation time of a single digital delay-element.

A wide-range, high-frequency, high-resolution output signal may generated with high-resolution variable duty-cycle.

In one aspect, the frequency synthesizer is implemented by using all-digital standard-cell approach with a single supply domain without modifications, for allowing design using a generic digital flow procedure.

In one aspect, the frequency synthesizer is based on asynchronous hardware and combinatorial circuits, thereby eliminating the need for complex and power-hungry hardware for timing and high-speed synchronization.

A high-resolution output signal may be generated based on the internal high-resolution reference clock $f_{ring}$ and the coarse-tuning signal.

A method for generating high-resolution switching frequency for wireless power systems, comprising the steps of:

a. generating an internal high-resolution reference clock signal $f_{ring}$ by digitally controlled tunable ring-oscillator, based on a chain of delay-line cells (DLs);

b. receiving by a tuner unit, a compensation/target signal and performing arithmetic operations that produce auxiliary unit signals provided to the ring-oscillator, for allowing the ring-oscillator to generate a high-resolution output period/frequency;

c. providing, by a counter-comparator unit, ultra-fine tuning signal for tuning the frequency resolution of digitally controlled ring-oscillator; and d. enhancing, by an adaptive Fractional-N dithering module, the frequency resolution of the digitally controlled ring-oscillator by averaging the resolution provided by a single cell of the ring-oscillator.

The extracted parameters coarse tuning, fine tuning, ultra-fine tuning and enhancement may be generated upon receiving every new frequency command.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF THE INVENTION

The present invention proposes a high-performance adaptive digital frequency synthesizer integrated circuit (IC) for wireless power systems (for WPT systems), which is wide-range, high-frequency, high-resolution and scalable. The frequency synthesizer is a key building block of WPT controllers, which compensates on-the-fly for variations in wireless power applications. The new proposed synthesizer IC relies on continuous tuning of the operating frequency to the target frequency, regardless of system variations and components drifts. The new proposed synthesizer design allows obtaining very high accuracy and frequency resolution, while saving silicon area and power consumption.

Figure 1:
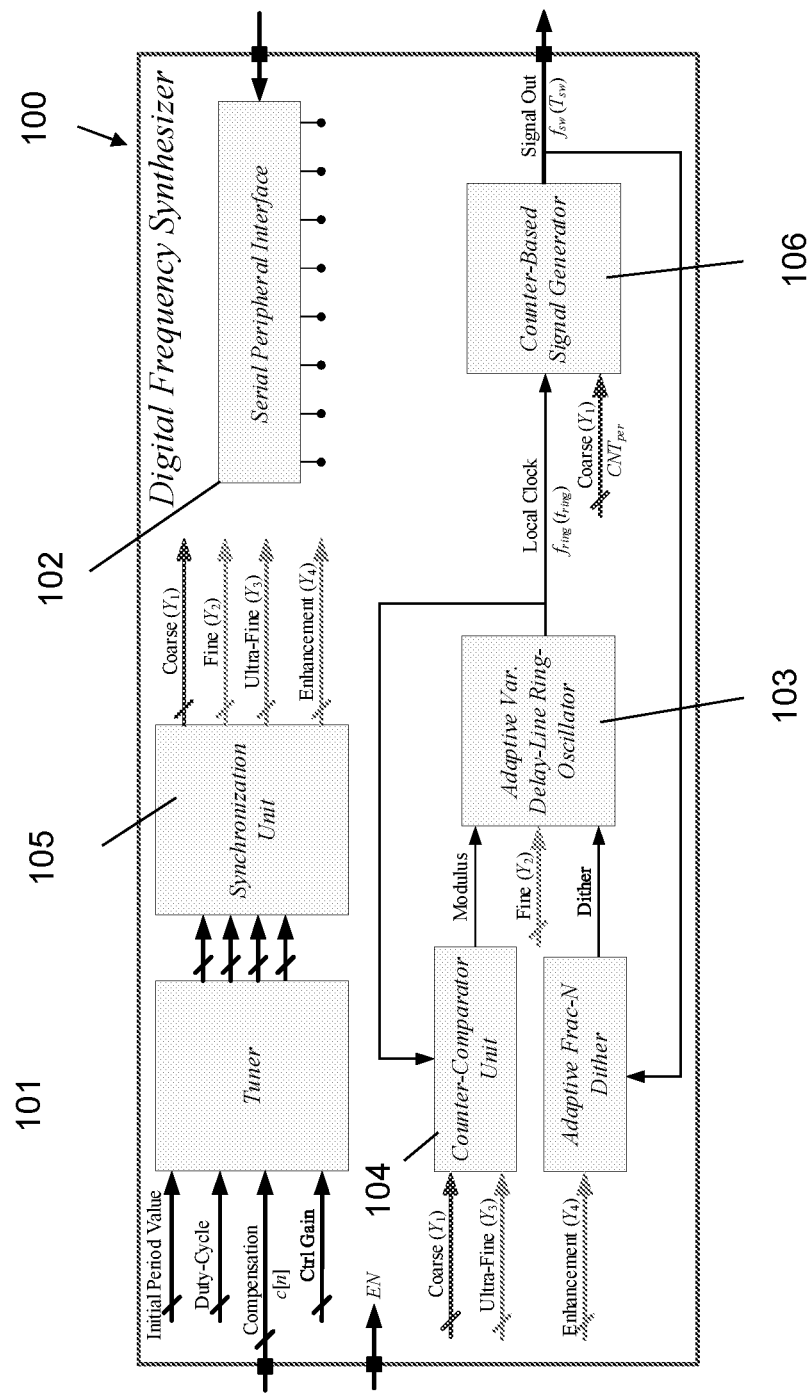
FIG. 1 shows a block diagram of a digital frequency synthesizer IC.

FIG. 1 is a block diagram of the proposed high-resolution synthesizer IC. The synthesizer 100 comprises a tuner unit 101, a Serial Peripheral Interface (SPI) 102 that is pre-programmed with a set of default values for the main parameters of the synthesizer such as:
- the initial period value;
- the reference value;
- the (variable) duty-cycle;
- the gain,
  which determine the target output period $T_{sw}$ and the derived output frequency $f_{sw}$.

These parameters are generated upon receiving every new frequency command.

The frequency synthesizer 101 is based on an adaptive digitally controlled tunable ring-oscillator 103, combined with a counter-comparator 104.

The output signal of the synthesizer 100 is generated based on coarse, fine and ultra-fine tuning signals provided to the ring-oscillator 103. These tuning signals are generated by the tuner unit 101, which receives a compensation (reference) signal, c[n], from a compensator and generates arithmetic operations which are determined by a local Arithmetic Logic Unit (ALU) as detailed later on with respect to FIG. 3A. A synchronization unit 105 is responsible for simultaneously passing and locking the tuning signals (received from tuner unit 101) every switching cycle, so as to avoid frequency glitches and false frequency tuning. The synchronization unit 105 outputs (locked) tuning signals $Y_1$, $Y_2$, $Y_3$ and $Y_4$, which represent the coarse-tuning, fine-tuning, ultra-fine tuning and an enhancement signal, respectively. These tuning signals are essential to obtain accurate, stable, wide range, high-frequency operation while maintaining a single delay-cell resolution, without significant penalty on the power consumption and silicon area, as will be described later on.

The value of the coarse-tuning signal $Y_1$ defines how many ring-oscillator cycles are needed for generating the output period $T_{sw}$ by a counter-based signal generator 106. The value of the fine-tuning signal ($Y_2$) controls the delay ring size, i.e., how many extra delay elements should be added to the basic ring-oscillator string to improve the resolution. The value of the ultra-fine value ($Y_3$) defines how many ring cycles should have an additional delay element within the output period.

For a case in which finer resolution of the output signal is further required, a frequency dithering feature [32]-[35] has been embedded in the frequency synthesizer. The enhancement signal ($Y_4$) defines when to add extra delay element to the ring-oscillator string, for further improving the resolution of the output period, effectively finer than a single cell resolution.

For example, if the delay of a single delay stage is 1 nS and the desired resolution is 10.5 nS, then two cycles of the ring oscillator will be required: the first cycle will include the counting of 10 delay stages and the second cycle will include the counting of 11 delay stages. The average will be a delay of 10.5 nS. If the desired resolution is 10.1 nS, then two cycles of the ring oscillator will be required: the counting cycles will include the counting of 10 delay stages 90 times and the last cycle will include the counting of 11 delay stages. The average will be a delay of 10.1 nS.

Figure 2:
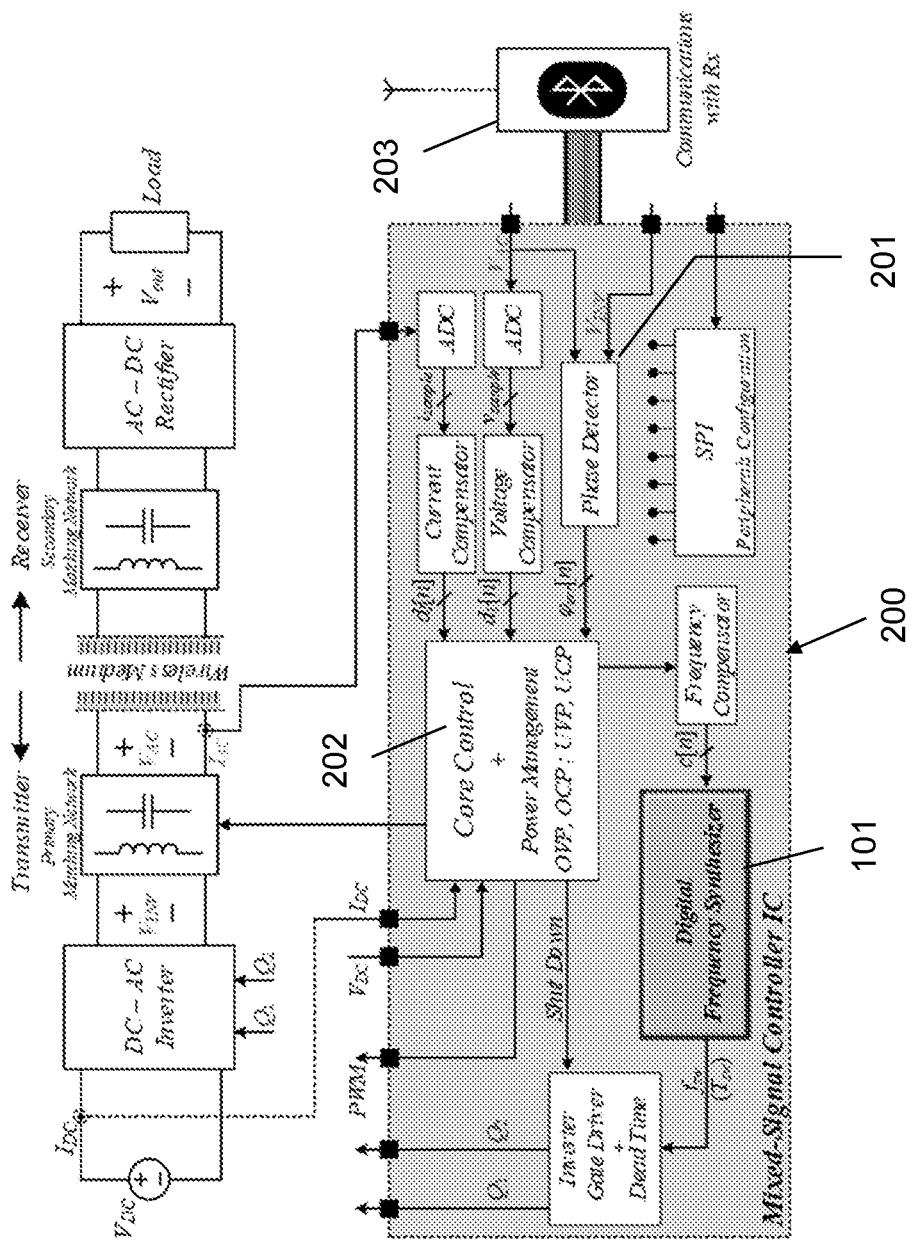
FIG. 2 shows a simplified diagram of a WPT system with frequency-based controller.

FIG. 2 shows typical block diagram of a near-field WPT system with frequency-based controller 200. To achieve suitable degrees of freedom in terms of design, performance and overall input-output relationships in any WPT system, primary and secondary matching networks for both the transmitter and receiver are used.

The controller core primarily relies on several building blocks: (i) frequency synthesizer 101, (ii) a phase detector 201, (iii) and core control and power management module 202 to process various measurements from the system and thereby provide the necessary control signals to the DC-AC inverter. Typically, in frequency-based controllers for WPT systems, the phase detector 201 provides phase difference between measured voltage/current signals of the transmitter, to provide correction signal for the frequency synthesizer 101. In WPT systems which consist of a pre-regulation stage, the controller provides the required PWM control signal.

If an adaptive matching circuit is employed within the system, the controller 200 provides the necessary control signals to adjust the passive components. The controller 200 also processes information from the receiver provided via a communication interface 203 (typically Bluetooth), for allowing device/s to connect (disconnect), adjustments in control signals and other system parameters that allows proper wireless power operation.

Figure 3A:
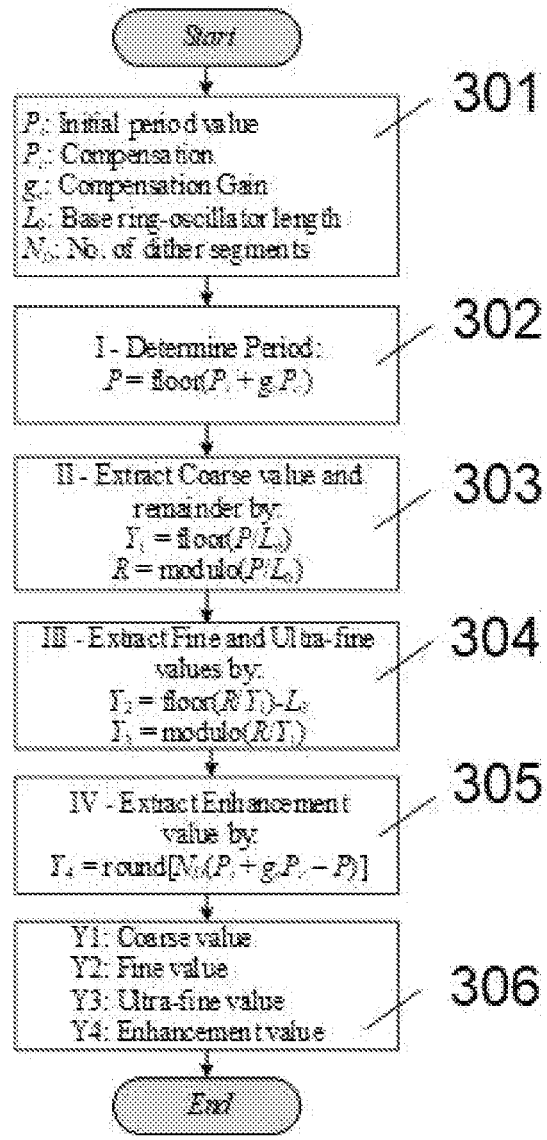
FIGS. 3A-3C show a conceptual flowcharts of a frequency synthesizer algorithm.
Figure 3B:
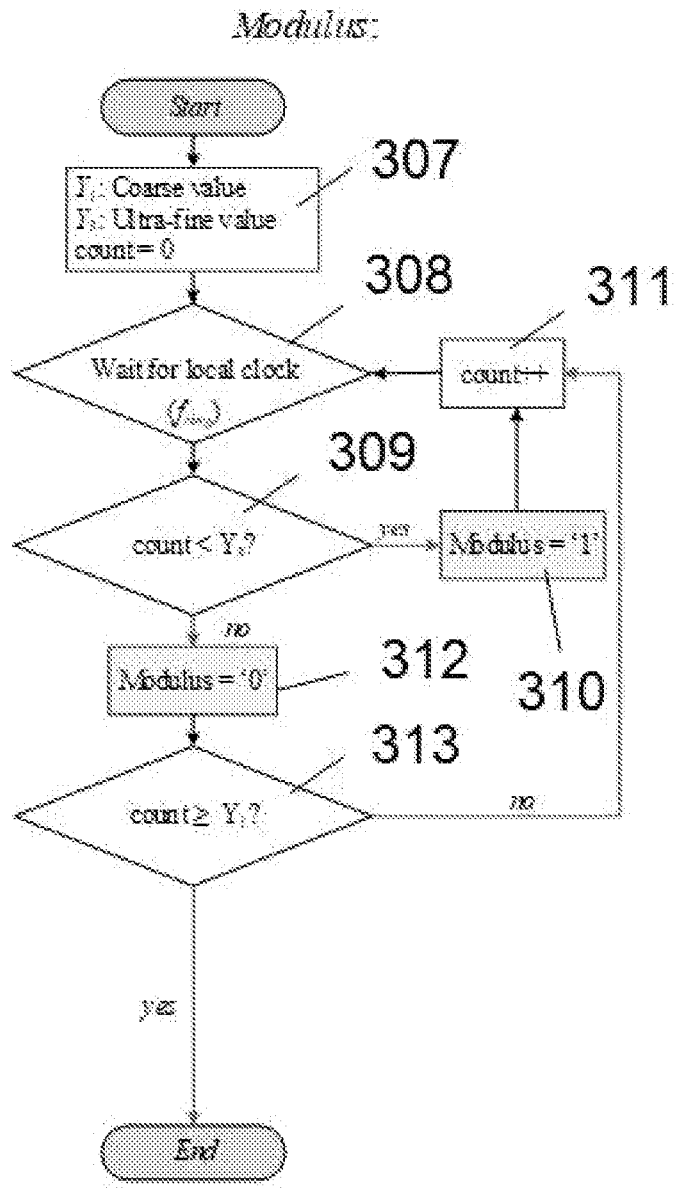
Figure 3C:
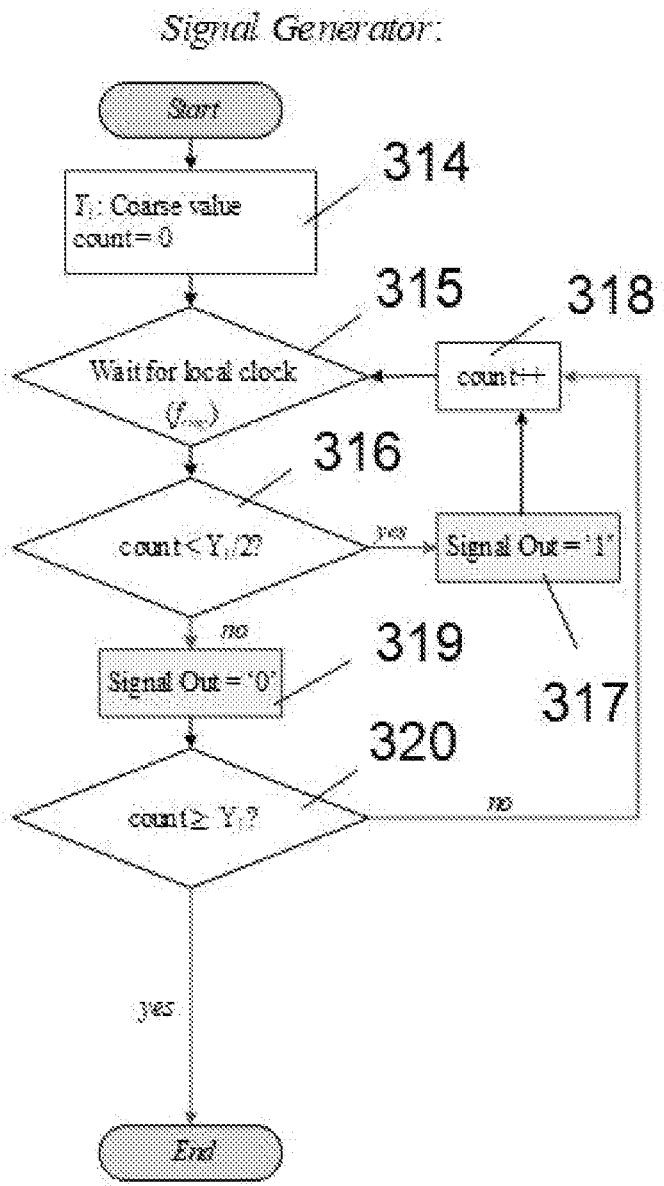

FIGS. 3A-3C illustrate flowcharts of the frequency regulation procedure, describing the principle of operation of the new high-performance digital frequency synthesizer IC.

The coarse-tuning (denoted as $Y_1$) defines how many ring-oscillator cycles are needed for generating the output period. The fine-tuning value ($Y_2$) controls the delay ring size, i.e., how many extra delay elements should be added to the basic ring-oscillator string to improve the resolution. The ultra-fine value ($Y_3$) defines how many ring cycles should have an additional delay element within the output period. Based on the ultra-fine and coarse signals, a counter-comparator unit is responsible for enabling the additional delay (as shown in FIG. 3B). For a case in which finer resolution of the output signal is further required, a frequency dithering (dithering is the process of adding noise to a signal, in an effort to mask and randomize higher-order harmonics, and in turn, make quantization distortion less perceivable) feature [32]-[35] outputting an enhancement signal ($Y_4$) has been embedded in the frequency synthesizer. The enhancement signal ($Y_4$) defines and enables to add extra delay element to the ring-oscillator string, for further improving the resolution of the output period, effectively finer than a single cell resolution.

Once all arithmetic operations and conditions have been performed, and the number of delay elements within the string have been adjusted accordingly in real-time, a high-resolution output period is generated (as shown in FIG. 3C). It should be noted that by default, the duty-cycle of the output signal is 50% but if required, it can be also adjusted with high-resolution tuning. One of the constraints to guarantee proper operation of the synthesizer, is that the internal high-resolution reference clock signal $f_{ring}$ (Local Clock) should be greater than $f_{sw}$ by an order of magnitude. On the other hand, to obtain hardware-efficient design, too high $f_{ring}$ is not desired.

FIG. 3A is a flowchart of the operations performed to generate the signals $Y_1$, $Y_2$, $Y_3$, $Y_4$ provided by the tuner 101 and the synchronization unit 105. At the first step 301, an initial period value, the duty cycle, the value of the compensation (reference) signal and the control gain are input to the tuner 101. At the next step 302 the period P is determined as $P=\text{floor}(P_i+g_cP_c)$, where $P_i$ is the initial period value; $g_c$ is the compensation gain; and $P_c$ is the compensation value.

At the next step 303 the coarse value $Y_1$ and the remainder R are determined as $P=\text{floor}(P/L_0)$;

$R=\text{modulo}(P/L_0)$;

where $L_0$ is the base ring oscillator length.

At the next step 304 the fine value $Y_2$ and the ultra-fine value $Y_3$ are determined as $Y_2=\text{floor}[(R/Y_1)-L_0]$;

$Y_3=\text{modulo}(R/Y_1)$.

At the next step 305 the enhancement value $Y_4$ and is determined as $Y_4=\text{round}[N_D(P_i+g_cP_c-P)]$;

$R=\text{modulo}(P/L_0)$;

where $L_0$ is the base ring oscillator length.

FIG. 3B is a flowchart of the operations performed to generate the modulo signal provided by the counter-comparator unit 104. At the first step 307, the values $Y_1$ and $Y_3$ are input to the counter-comparator unit 104 and the count value is set to 0. At the next step 308, the counter-comparator unit 104 waits to receive the local clock signal of the ring oscillator 103. At the next step 309, the process checks if count<$Y_3$. If yes, at the next step 310 the modulo value is set to "1" and counting is advanced at step 311 using the "1". If no, at the next step 312, the modulo value is set to "0". At the next step 313, the process checks if count≥$Y_1$. If no, counting is advanced at step 311 using the "0". If yes, the modulo signal is determined.

FIG. 3C is a flowchart of the operations performed to generate the output frequency $f_{sw}$ provided by the counter-based signal generator 106. At the first step 307, the value $Y_1$ is input to the counter-based signal generator 106 and the count value is set to 0. At the next step 315, the counter-based signal generator 106 waits to receive the local clock signal of the ring oscillator 103. At the next step 316, the process checks if count<$Y_1/2$. If yes, at the next step 317 the output value is set to "1" and counting is advanced at step 318 using the "1". If no, at the next step 319, the output value is set to "0". At the next step 320, the process checks if count≥$Y_1$. If no, counting is advanced at step 318 using the "0". If yes, output signal is determined.

To demonstrate the operation of the frequency synthesizer based on the algorithm delineated in FIGS. 3A-3C, a numeric example that illustrates the generation of a high-resolution output signal is given as follows:

a. Given target frequency of $f_{sw}$=6.785 MHz, which translated to time period of $T_{sw}$=147.384 ns.
b. Given that the propagation time of a single delay element is $t_{DE}$=200 ps; $(P_i+g_cP_c)$ can be found by the ratio between $T_{sw}$ and $t_D$ as follows:

$P_i+g_cP_c=T_{sw}/t_{DE}$=736.920 c. According to stage I (FIG. 3A), P=736.
d. Given that the base ring-oscillator length is $L_0$=64, according to stage II (FIG. 3A) the coarse value $Y_1$=11, with residue of R=32.
e. According to stage III (FIG. 3A) the fine value $Y_2$=2, and the ultra-fine value $Y_3$=10.
f. Given that the number of dither segments is $N_D$=8, according to stage IV (FIG. 3A) the enhancement value $Y_4$=7.
g. Having the auxiliary tuning signals $Y_1$-$Y_4$, the operations in FIGS. 3B and 3C can be activated; thus, a high-resolution output signal can be generated.

The present invention proposes the realization of both area and power efficient high-performance frequency synthesizer IC suitable for the strict demands of WPT systems in general, and in particular of resonant-based WPT systems [36], [37]. The main enabler to achieve the latter is that the fundamental units in this invention have been implemented as an asynchronous hardware based on standard-cell delay-lines (DL) and combinatorial circuits [38], [39]. By doing so, a significant portion of complex and power-hungry hardware for timing and high-speed synchronization is eliminated.

Figure 4:
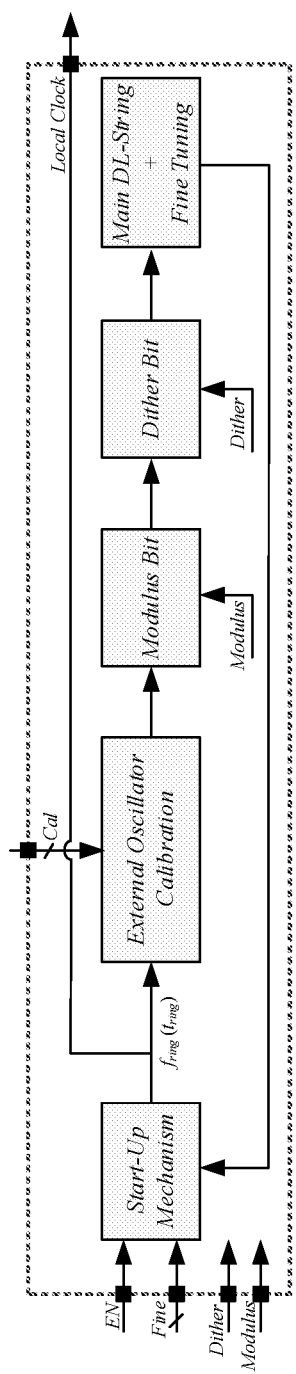
FIG. 4 shows a high-level block diagram of an adaptive variable ring-oscillator.

In contrast to many implementations that use ring-oscillators for digital frequency synthesizers [40]-[42], the DL-based ring-oscillator used by the present invention consists of an adaptive tuning feature. FIG. 4 is a block diagram of the adaptive variable ring-oscillator.

Figure 5:
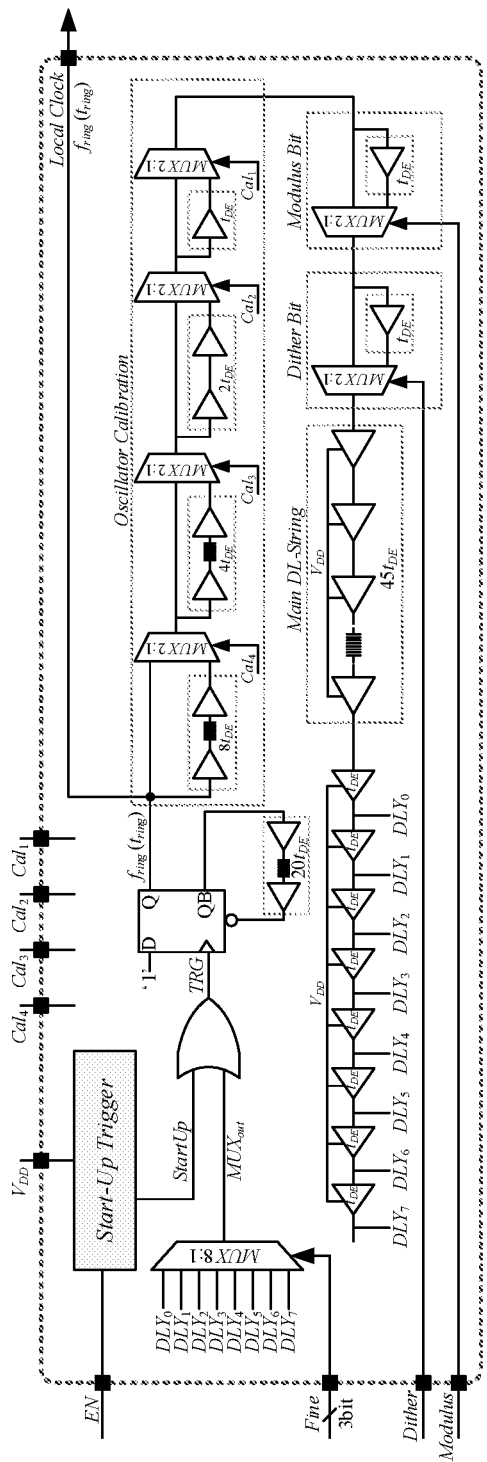
FIG. 5 shows a detailed schematic diagram of an adaptive DL-based ring-oscillator.

FIG. 5 is a block diagram of the oscillator's architecture that has been developed on the basis of all-digital standard-cell approach with a single supply domain, and can therefore be designed using a generic digital flow procedure, which is very beneficial in terms of scalability and technology advancements. Due to possible variations in the process, voltage, and temperature variations and other potential post-fabrication mismatches, the propagation time of the entire DL string $t_{ring}$ can be manually calibrated by adding/removing delay elements within the ring-oscillator (by using the SPI 102). By default, $t_{ring}$ is pre-defined to be in the middle of the calibration span. In the present invention, the oscillator can be calibrated to 16 different options, and is able to generate frequencies between approximately 1-to-10 MHz.

The general frequency relationships of the frequency synthesizer are expressed as follows:

$$f_{ring} = \frac{1}{\frac{Nt_{DE}}{t_{ring}}} \Rightarrow f_{sw} = \frac{f_{ring}}{CNT_{per}} = \frac{1}{CNT_{per}t_{ring}} \quad (1)$$

where $f_{ring}$ is the frequency of the ring-oscillator 103 (denoted as 'Local Clock' at FIG. 1 and represents an internal high-resolution reference clock signal), $t_{DE}$ is the delay of a single delay-element within the ring-oscillator, N is adjustable overall number of the delay elements in the ring, and $CNT_{per}$ is an integer represents the coarse value of the counter for generating the target output frequency $f_{sw}$ (period-$T_{sw}$). From Formula (1), it can be observed that $f_{sw}$ can be varied by adjusting $t_{ring}$ and $CNT_{per}$.

$t_{ring}$ is primarily determined by the main DL string (as shown at FIG. 5), and can be adjusted by: (i) fine value which with the aid of the MUX determines how many extra DE ($DLY_0$-$DLY_7$) would be added to the main DL string to improve the resolution; (ii) modulus bit (produced by a modulus bit block), which is determined by the ultra-fine value; (iii) dither bit (produced by a dither bit module) which enables to further improve the resolution of $t_{ring}$, is determined by the enhancement value.

The frequency resolution of the frequency synthesizer, $f_{res}$, can be calculated as the LSB change in $CNT_{per}$:

$$f_{res} = \Delta f_{sw} = \frac{1}{CNT_{per}t_{ring}} - \frac{1}{(CNT_{per}+1)t_{ring}} \approx \frac{1}{CNT_{per}^2 t_{ring}} = t_{ring}f_{sw}^2 \quad (2)$$

From Formula (2), it can be observed that the frequency steps of the synthesizer are limited by the module's base frequency, and increase as the square of the operating frequency, i.e., at lower operating frequency, the frequency resolution would be finer than what can be achieved at a higher frequency. Since finer resolution is desired for the entire operating range, an effective, fast dynamics and low distortion, frequency enhancement dithering procedure has been employed [32]-[35].

Dithering Feature

Some commercial microcontroller products include a frequency resolution enhancement (hardware embedded) by a variation of Frac-N method and additional features dedicated to power applications [43]-[46]. A significant drawback of the approach implemented in these products, which is based on the use of a fixed dither period for all fractional frequencies of the digitally controlled oscillator, is a considerably slow response of the system in closed-loop operation.

In the present invention, an adaptive Fractional-N dithering method for enhancing the frequency resolution of the digitally controlled oscillator has been realized.

Figure 6:
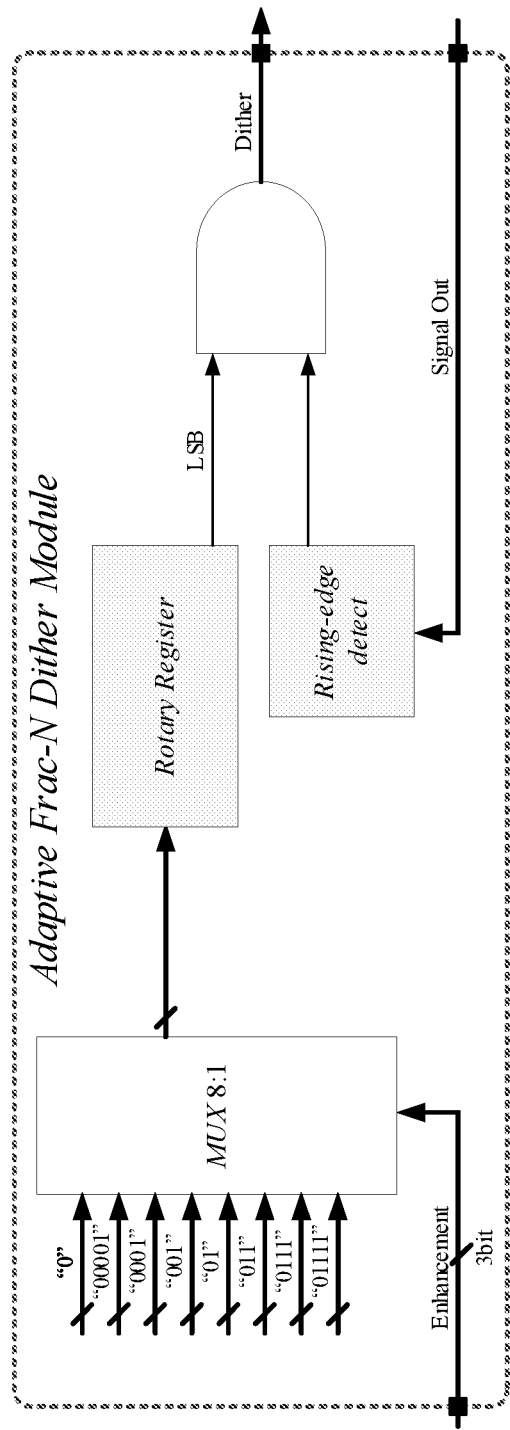
FIG. 6 shows a block diagram of a 3-bit Frac-N dithering module.

FIG. 6 is a block diagram of a 3-bit Fractional-N dithering module. The method of its operation applies an adaptive dither rate based on the desired accuracy (an enhancement signal which is determined by the tuner unit 101) which improves the resolution of the ring-oscillator and hence the overall resolution of the frequency synthesizer is significantly improved. The implementation of the dither algorithm on digital platforms is straightforward with minimum hardware complexity.

The adaptive Fractional-N dithering method is facilitated by dithering the oscillator between $CNT_{per}$ and $CNT_{per}+1$ at a defined rate, varied by the required accuracy. The dither factor, n, is the number of oscillator cycles needed to achieve the desired fractional frequency. Dithering is accomplished by keeping a constant period over (n−1) oscillator cycles (referred as base period) and then changing the last slot (n) to another period. Then, the resolution provided by a single delay-line cell of the ring-oscillator, is averaged. The resultant (average) frequency in this method can be calculated by a general expression as follows:

$$f_{sw\_dither} = \frac{1}{[(n-1)CNT_{per} + (CNT_{per}+1)]/nt_{DE}} = \frac{1}{(CNT_{per}+1/n)t_{DE}}; \quad (3)$$

$$n = 1, 2, 3 \ldots$$

and the enhanced frequency resolution:

$$f_{res\_dither} = \quad (4)$$

$$\frac{1}{(CNT_{per}+1/n+1)t_{DE}} - \frac{1}{(CNT_{per}+1/n)t_{DE}} \approx \frac{1}{n(n+1)CNT_{per}^2 t_{DE}} = \frac{t_{DE}f_{sw}^2}{n(n+1)}$$

Figure 7:
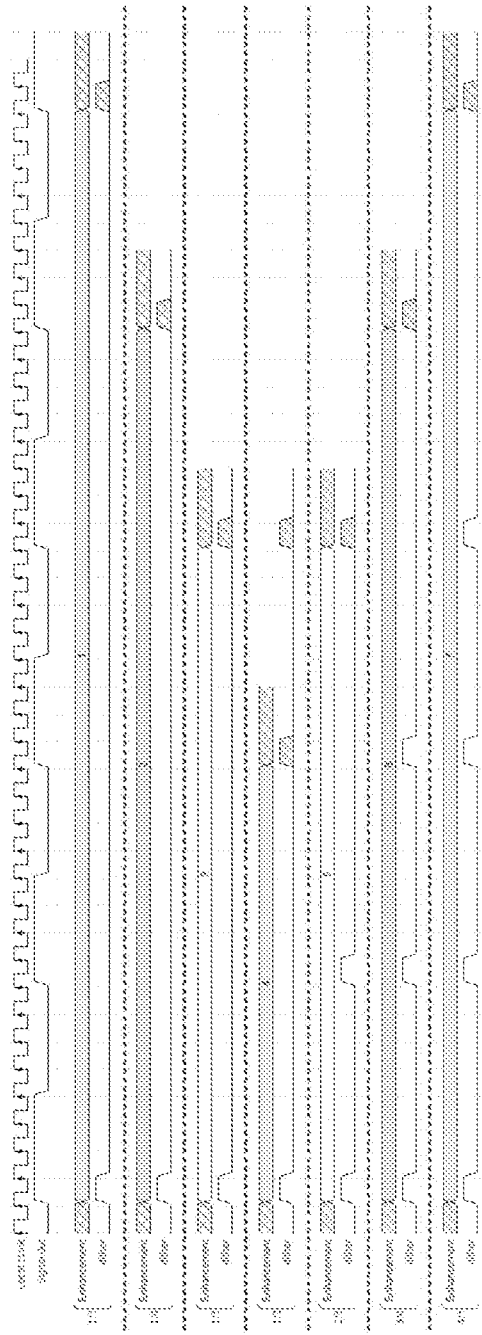
FIG. 7 shows a timing sequence of the system for different dither rates.

An example for dither rates that can be generated by a 3-bit Fractional-N dithering module with respect to the Enhancement value and Local Clock signal is shown in FIG. 7.

Start-Up Circuitry

Unlike conventional ring-oscillators (inverter-based strings) that are self-oscillating once $V_{DD}$ rail is supplied to the IC, the oscillator used by the present invention primarily relies on delays and counting the propagation of '1' within the string. This implies that for ramping-up the oscillator (and the frequency synthesizer) and stimulating the system, high logic level needs to propagate within the DL string at initialization.

Figure 8A:
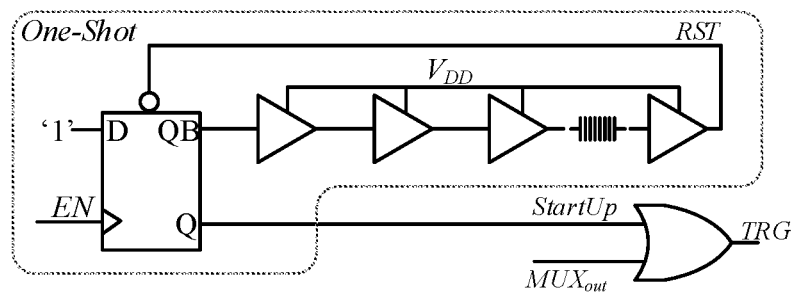
FIG. 8A shows a schematic diagram of the DL-based one-shot timer for the startup procedure.
Figure 8B:
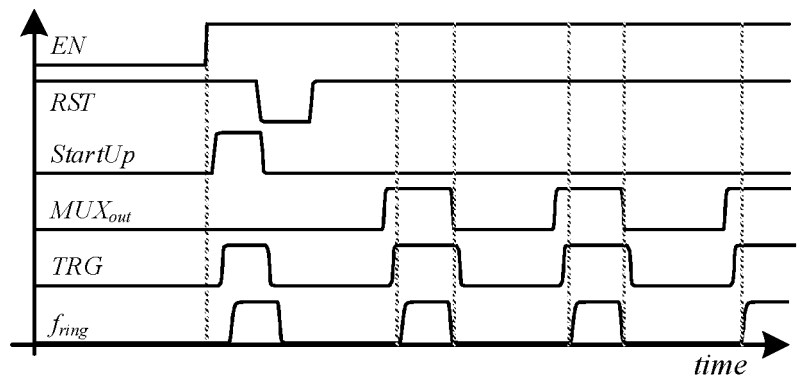
FIG. 8B shows ring-oscillator waveforms at start-up.

To overcome this issue and to implement a simple yet efficient enable/disable mechanism for the ring-oscillator in the present invention, a DL-based one-shot timer has been realized, as shown at FIG. 8A. Once the enable signal, EN, is provided to the IC, at initialization the flip-flop generates '1' that is being passed throughout the ring-oscillator string triggering the system (by a triggering signal), and therefore, an initial $f_{ring}$ is generated. Since the oscillator is an adaptive standalone unit that depends on the value of $MUX_{out}$ signal, the one-shot timer generates a short pulse that is determined by the propagation time of QB. Therefore, after initialization only $MUX_{out}$ is responsible for triggering the oscillator every cycle. An Illustrative example that depicts the waveforms of the oscillator at start-up procedure is shown at FIG. 8B.

Post-Layout Verification

Figures 9A, 9B:
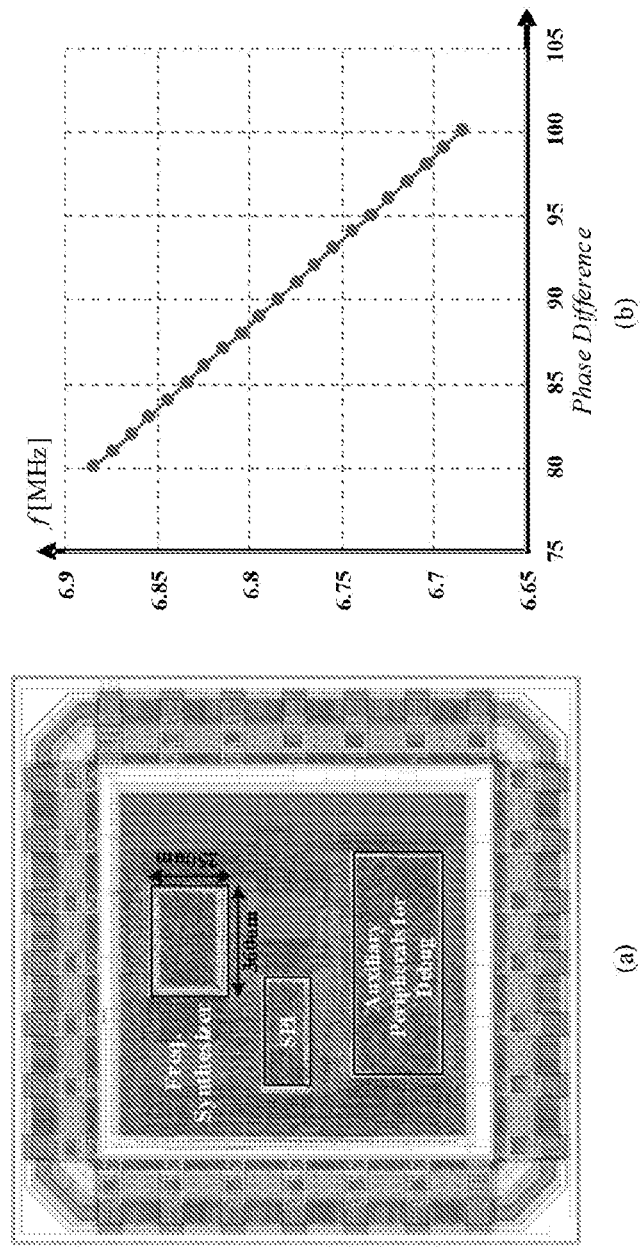
FIG. 9A shows a Layout of the frequency synthesizer IC.
FIG. 9B shows post-layout results—frequency resolution at the ISM frequency of 6.78 MHz.

A high-performance frequency synthesizer IC has been designed and implemented in 0.18-µm, where the effective die area of the synthesizer is 0.1 mm², the chip layout is shown at FIG. 9A.

The operation of the IC has been verified with post-layout results using Cadence Virtuoso platform. Post-layout analysis (as shown in FIG. 9B) shows that at ISM frequency of 6.78 MHz, the effective frequency resolution is approximately ±1.25 kHz, which satisfies the allocated frequency bandwidth according to alliance for wireless power consortium [47].

While some embodiments of the invention have been described by way of illustration, it will be apparent that the invention can be carried out with many modifications, variations and adaptations, and with the use of numerous equivalents or alternative solutions that are within the scope of persons skilled in the art, without exceeding the scope of the claims.

REFERENCES

[1] T. Imura and Y. Hori, "Maximizing air gap and efficiency of magnetic resonant coupling for wireless power transfer using equivalent circuit and Neumann formula," *IEEE Trans. Ind. Electron*, vol. 58, no. 10, pp. 4746-4752, October 2011.

[2] T. Langlotz, T. Nguyen, D. Schmalstieg, and R. Grasset, "Next generation augmented reality browsers: Rich, seamless, and adaptive," in *Proc. IEEE*, vol. 102, no. 2, pp. 155-169, February 2014.

[3] D. Xu, L. Han, M. Tan, and Y. F. Li, "Ceiling-based visual positioning for an indoor mobile robot with monocular vision," *IEEE Trans. Ind. Electron*, vol. 56, no. 5, pp. 1617-1628, May 2009.

[4] S. Li and C. Mi, "Wireless Power Transfer for Electric Vehicle Applications," *IEEE Journal of Emerging and Selected Topics in Power Electronics*, vol. PP, pp. 1-1, 2014.

[5] S. Jaegue et al., "Design and implementation of shaped magnetic resonance-based wireless power transfer system for roadway-powered moving electric vehicles," *IEEE Trans. Ind. Electron*, vol. 61, no. 3, pp. 1179-1192, March 2014.

[6] L. Collins, "Cut the cord," *Electron. Syst. Softw*, vol. 5, no. 6, pp. 42-46, January-December 2007.

[7] F. Musavi and W. Eberle, "Overview of wireless power transfer technologies for electric vehicle battery charging," *IET Power Electronics*, vol. 7, no. 1, pp. 60-66, 2014.

[8] D. C. Bock, A. C. Marschilok, K. J. Takeuchi, and E. S. Takeuchi, "Batteries used to power implantable biomedical devices," *Electrochimica Acta*, vol. 84, pp. 155-164, 2012.

[9] F. Lu, H. Zhang, C. Mi, "A two-plate capacitive wireless power transfer system for electric vehicle charging Applications," *IEEE Trans. Power Electron*, vol. 33, no. 2, pp. 946-969, August 2017.

[10] F. Lu, H. Zhang, H. Hofmann, and C. Mi, "A double-sided LC compensation circuit for loosely-coupled capacitive power transfer," *IEEE Trans. Power Electron*, vol. 33, no. 2, pp. 1633-1643, February 2017.

[11] J. Dai and D. C Ludois, "A survey of wireless power transfer and a critical comparison of inductive and capacitive coupling for small gap applications," *IEEE Trans. Power Electron*, vol. 30, no. 11, pp. 6017-6029, November 2015.

[12] F. Lu, H. Zhang, H. Hofmann, and C. Mi, "A double-sided LCLC compensated capacitive power transfer system for electric vehicle charging," *IEEE Trans. Power Electron*, vol. 30, no. 11, pp. 6011-6014, June 2015.

[13] H. Zhang, F. Lu, H. Hofmann, W. Liu, and C. C. Mi, "A four-plate compact capacitive coupler design and LCL-compensated topology for capacitive power transfer in electric vehicle charging application," *IEEE Trans. Power Electron*, vol. 31, no. 12, pp. 8541-8551, December 2016.

[14] F. Lu, H. Zhang, H. Hofmann, C. Mi, "A loosely coupled capacitive power transfer system with LC compensation circuit topology," *Proc. IEEE Energy Conyers. Congr. Expo. (ECCE)*, pp. 1-5, 2016.

[15] F. Lu, H. Zhang, H. Hofmann, and C. Mi, "A double-sided LC compensation circuit for loosely-coupled capacitive power transfer," *IEEE Trans. Power Electron*, vol. 33, no. 2, pp. 1633-1643, February 2017.

[16] H. Li, J. Li, K. Wang, W. Chen, and Y. Xu, "A maximum efficiency point tracking control scheme for wireless power transfer systems using magnetic resonant coupling," *IEEE Trans. Power Electron*, vol. 30, no. 7, pp. 3998-4008, July 2015.

[17] T. D. Yeo, D. Kwon, S. T. Khang, and J. W. Yu, "Design of maximum efficiency tracking control scheme for closed-loop wireless power charging system employing series resonant tank," *IEEE Trans. Power Electron*, vol. 32, no. 1, pp. 471-478, January 2017.

[18] N. Y. Kim, K. Y. Kim, J. Choi, and C. W. Kim, "Adaptive frequency with power-level tracking system for efficient magnetic resonance wireless power transfer," *Electron. Lett*, vol. 48, no. 8, pp. 452-454, April 2012.

[19] N. Y. Kim et al., "Automated adaptive frequency tracking system for efficient mid-range wireless power transfer via magnetic resonant coupling," in *Proc. 42nd Eur. Microw. Conf.,* 2012, pp. 221-224.

[20] K. Lu, S. K. Nguang, S. Ji, and L. Wei, "Design of auto frequency tuning capacitive power transfer system based on class-$E^2$ dc/dc converter,"*IET Power Electronics*, vol. 10, no. 12, pp. 1588-1595, 2017.

[21] M. Kline, I. Izyumin, B. Boser, and S. Sanders, "Capacitive power transfer for contactless charging," in Proc. *IEEE Appl. Power Electron. Conf. Expo.,* 2011, pp. 1398-1404.

[22] P. Si, A. P. Hu, S. Malpas, and D. Budgett, "A frequency control method for regulating wireless power to implantable devices," *IEEE Trans. Biomed. Circuits Syst*, vol. 2, no. 1, pp. 22-29, March 2008.

[23] Y. Jiang et al. "Analysis, Design and implementation of WPT system for EV's battery charging based on optimal operation frequency range," in *IEEE Transactions on Power Electronics*, vol. 34, no. 7, pp. 6890-6905, July 2018.

[24] Y. Jiang, Y. Wang, J. Liu, X. Li, and L. Wang, "An accurate phase detection method for realizing ZVS of high frequency inverter in wireless power transmission," in *Proc. Future Energy Electron. Conf. ECCE Asia*, 2017, pp. 1380-1384.

[25] H. G. Park et al., "A design of a wireless power receiving unit with a high-efficiency 6.78-MHz active rectifier using shared DLLs for magnetic-resonant A4 WP applications," *IEEE Trans. Power Electron*, vol. 31, no. 6, pp. 4484-4498, June 2016.

[26] E. Abramov, T. Vekslender, O. Kirshenboim, and M. M. Peretz, "Fully-integrated digital average current-mode control voltage regulator module IC," *IEEE Journal on Emerging and Selected Topics in Power Electronics*, vol. 6, no. 2, pp. 549-562, June 2018.

[27] M. Rodriguez, Y. Zhang, and D. Maksimovic, "High-frequency PWM buck converters using GaN-on-SiC HEMTs," *IEEE Trans. Power Electron*, vol. 29, no. 5, pp. 2462-2473, May 2014.

[28] Y. Zhang, M. Rodriguez, and D. Maksimovic, "Very high frequency PWM buck converters using monolithic GaN half-bridge power stages with integrated gate drivers," *IEEE Trans. Power Electron*, vol. 31, no. 11, pp. 7926-7942, November 2016.

[29] Altera (2012, September) Transciever Overview: Stratix IV and Hard-Copy IV. [Online]. Avialable:

http://www.altera.com/devices/fpga/stratixfpgas/stratix-iv/transceivers/stxiv-transceivers.html
[30] B. H. Waters, A. P. Sample, J. R. Smith, "Adaptive impedance matching for magnetically coupled resonators," in *Proc. Prog. Electromagn. Res. Symp.*, 2012, pp. 694-701.
[31] F. C. Commission, "Cfr 18-industrial, scientific and medical equipment," *Code Federal Regulations*, pp. 862-868, 2008.
[32] M. M. Peretz and S. Ben-Yaakov, "Digital control of resonant converters: enhancing frequency resolution by dithering," in *Proc. IEEE Applied Power Electronics Conference and Exposition (APEC)*, February 2009, pp. 1202-1207.
[33] M. Hovin, A. Olsen, T. S. Lande, and C. Toumazou, "Delta-sigma modulators using frequency-modulated intermediate values", *IEEE Journal of Solid-State Circuits*, vol. 32, no. 1, pp. 13-22, January 1997.
[34] A. V. Peterchev and S. R. Sanders, "Quantization resolution and limit cycling in digitally controlled PWM converters," *IEEE Trans. Power Electron*, vol. 18, no. 1, pp. 301-308, January 2003.
[35] Z. Lukic, N. Rahman, and A. Prodic, "Multi-bit S-D PWM digital controller IC for DC-DC converters operating at switching frequencies beyond 10 MHz," *IEEE Trans. Power Electron*, vol. 22, no. 5, pp. 1693-1707, September 2012.
[36] Z. Pantic and S. M. Lukic, "Framework and topology for active tuning of parallel compensated receivers in power transfer systems," *IEEE Trans. Power Electron*, vol. 27, no. 11, pp. 4503-4513, November 2012.
[37] B. L. Cannon, J. F. Hoburg, D. D. Stancil, and S. C. Goldstein, "Magnetic resonant coupling as a potential means for wireless power transfer to multiple small receivers," *IEEE Trans. Power Electron*, vol. 24, no. 7, pp. 1819-1825, July 2009.
[38] B. J. Patella, A. Prodić, A. Zirger, and D. Maksimović, "High-frequency digital PWM controller IC for DC-DC converters," *IEEE Trans. Power Electron*, vol. 18, no. 1, pp. 438-446, January 2003.
[39] O. Trescases, A. Prodić, Wai Tung Ng, "Digitally controlled current-Mode DC-DC converter IC," *IEEE Trans. Circuits Syst. I, Reg. Papers*, vol. 58, no. 1, pp. 219-231, January 2011.
[40] A. Abidi, "Phase noise and jitter in CMOS ring oscillators," *IEEE J. Solid-State Circuits*, vol. 41, no. 8, pp. 1803-1816, August 2006.
[41] Pepe, Federico and Pietro Andreani. "An accurate analysis of phase noise in CMOS ring oscillators." *IEEE Transactions on Circuits and Systems II: Express Brief*, vol. 66, no. 8, pp. 1292-1296, December 2018.
[42] W. Bae, H. Ju, K. Park, S-Y. Cho, and D-K. Jeong, "A 7.6 mW, 414 fs RMS-jitter 10 GHz phase-locked loop for a 40 Gb/s serial link transmitter based on a two-stage ring oscillator in 65 nm CMOS,' *IEEE J. Solid-State Circuits*, vol. 51, no. 10, pp. 2357-2367, October 2016.
[43] Atmel Corporation, "AT90PWMx microcontrollers data sheet", available at www.atmel.com, Doc No. doc7710.pdf.
[44] Microchip Technology, "dsPIC30F SMPS reference manual, sec. 29 oscillator section", available at www-.microchip.com, Doc No. 70268A.pdf.
[45] STMicroelectronics, "PWM resolution enhancement through a dithering technique for STM32 advanced-configuration, general-purpose and lite timers", available at www.st.com, Doc No. en.DM00119042.pdf.
[46] Texas Instrument, "AN-1879 Fractional N Frequency Synthesis", available at http://www.ti.com, Doc No. en.DM00119042.pdf.
[47] R. Tseng, B. von Novak, S. Shevde, and K. A. Grajski, "Introduction to the Alliance for Wireless Power Loosely-Coupled Wireless Power Transfer System Specification Version 1.0," IEEE Wireless Power Transfer Conference, Perugia, Italy, May 2013.

The invention claimed is:

1. A high-resolution adaptive digital frequency synthesizer integrated circuit (IC) for wireless power systems, comprising:
   a. a digitally controlled tunable ring-oscillator, based on a chain of delay-line cells (DLs) being adapted to generate an internal high-resolution reference clock signal ($f_{ring}$);
   b. a tuner unit for receiving as input a compensation/target signal and performing arithmetic operations that produce auxiliary tuning signals provided to said ring-oscillator, for allowing said ring-oscillator to generate a high-resolution output period/frequency;
   c. a counter-comparator unit introducing an additional delay to said chain, said counter-comparator unit operating in combination with said ring-oscillator and counts how many times the delay of the chain repeats, for providing ultra-fine tuning signal for tuning the frequency resolution of digitally controlled ring-oscillator; and
   d. an adaptive Fractional-N dithering module, for enhancing the frequency resolution of said digitally controlled ring-oscillator by averaging the resolution provided by a single delay-line cell of said ring-oscillator.

2. A frequency synthesizer according to claim 1, in which the tuner unit receives as input pre-defined parameters for initialization and a compensation/reference signal and outputs the following auxiliary tuning signals:
   a. a coarse-tuning signal ($Y_1$) that defines how many complete oscillator cycles are needed for generating the output period/frequency;
   b. a fine-tuning signal ($Y_2$) that defines how many extra delay elements should be added to the oscillator's chain to improve the resolution;
   C. an ultra-fine-tuning signal ($Y_3$) that defines how many oscillator cycles should have an additional delay element within the output period; and
   d. an enhancement signal ($Y_4$) that defines the sequencing of adding an extra delay element to the oscillator chain, for further improving the resolution of the output period to be finer than the resolution of a single delay-line cell.

3. A frequency synthesizer according to claim 1, further comprising a synchronization unit, for simultaneously passing and locking the auxiliary tuning parameters received from the tuner, and provided to the high-resolution internal reference clock signal during every period, to avoid frequency glitches and the generation of false frequency tuning signals.

4. A frequency synthesizer according to claim 1, wherein the counter-comparator unit receives as an input:
   a. the coarse tuning signal;
   b. the ultra-fine tuning signal; and
   c. the internal reference clock ($f_{ring}$),
   and outputs a modulus signal which allows adding an extra delay-line cell to the ring-oscillator, to improve the resolution of the output signal.

5. A frequency synthesizer according to claim 1, wherein the adaptive Dither unit comprises:

a logic component adapted to:
  receive the enhancement signal and the internal reference clock signal ($f_{ring}$) provided by the ring-oscillator;
  perform a logic operation between said enhancement signal and said internal reference clock signal ($f_{ring}$);
  produce a Dither signal which sequentially enables adding extra delay-element to the ring-oscillator, to further improve the resolution of the output signal.

6. A frequency synthesizer according to claim 1, wherein the adaptive ring-oscillator further comprises:
  a. a start-up circuit, which receives as input an enable signal and outputs a triggering signal to initiate a tuning procedure upon power-up of said frequency synthesizer, and to synthesize the internal reference clock ($f_{ring}$);
  b. a calibration module, which receives calibration signals from a serial communications port, and compensates for variations in process, voltage and temperature, and for post-fabrication mismatches;
  c. a Modulus bit block which receives as input the Modulus signal and a delayed version of said internal reference clock ($f_{ring}$) and increases or decreases the delay within the ring-oscillator;
  d. a Dither bit module for increasing/decreasing sequenced delay within the oscillator, which receives as input said Dither signal and a delayed version of said internal reference clock ($f_{ring}$); and
  e. main DL-string and fine-tuning DL-string for producing high-resolution feedback signal to fine-tune said internal reference clock ($f_{ring}$), which receives as input:
    i. said Dither signal; and
    ii. delayed version of said internal reference clock ($f_{ring}$).

7. A frequency synthesizer according to claim 6, wherein the trigger signal is generated by a one-shot timer, based on a chain of delay-line cells.

8. A frequency synthesizer according to claim 6, wherein a wide-range, high-frequency, high-resolution output signal is generated, with time resolution significantly finer than a propagation time of a single digital delay-element.

9. A frequency synthesizer according to claim 1, wherein a fixed-frequency is generated with high-resolution output signal, with time resolution significantly finer than a propagation time of a single digital delay-element.

10. A frequency synthesizer according to claim 1, wherein a wide-range, high-frequency, high-resolution output signal is generated with high-resolution variable duty-cycle.

11. A frequency synthesizer according to claim 1, implemented by using all-digital standard-cell approach with a single supply domain without modifications, for allowing design using a generic digital flow procedure.

12. A frequency synthesizer according to claim 9, based on asynchronous hardware and combinatorial circuits, thereby eliminating the need for complex and power-hungry hardware for timing and high-speed synchronization.

13. A frequency synthesizer according to claim 1, wherein a high-resolution output signal is generated based on the internal high-resolution reference clock ($f_{ring}$) and the coarse-tuning signal.

14. A method for generating high-resolution switching frequency for wireless power systems, comprising:
  a. generating an internal high-resolution reference clock signal ($f_{ring}$) by digitally controlled tunable ring-oscillator, based on a chain of delay-line cells (DLs);
  b. receiving by a tuner unit, a compensation/target signal and performing arithmetic operations that produce auxiliary unit signals provided to said ring-oscillator, for allowing said ring-oscillator to generate a high-resolution output period/frequency;
  c. providing, by a counter-comparator unit, ultra-fine tuning signal for tuning the frequency resolution of digitally controlled ring-oscillator; and
  d. enhancing, by an adaptive Fractional-N dithering module, the frequency resolution of said digitally controlled ring-oscillator by averaging the resolution provided by a single cell of said ring-oscillator.

15. A method according to claim 14, wherein extracted parameters being coarse tuning, fine tuning, ultra-fine tuning and enhancement are generated upon receiving every new frequency command.

* * * * *